(12) United States Patent
Reinmuth (10) Patent No.: US 9,422,152 B2
(45) Date of Patent: Aug. 23, 2016

(54) HYBRIDLY INTEGRATED MODULE HAVING A SEALING STRUCTURE

(71) Applicant: Robert Bosch GmbH, Stuttgart (DE)

(72) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/564,191

(22) Filed: Dec. 9, 2014

(65) Prior Publication Data
US 2015/0158718 A1  Jun. 11, 2015

(30) Foreign Application Priority Data
Dec. 10, 2013  (DE) .......................... 10 2013 225 375

(51) Int. Cl.
| | | |
|---|---|---|
| H01L 23/02 | (2006.01) | |
| B81B 7/00 | (2006.01) | |
| B81C 1/00 | (2006.01) | |
| H01L 23/10 | (2006.01) | |

(52) U.S. Cl.
CPC .............. *B81B 7/007* (2013.01); *B81C 1/0023* (2013.01); *B81C 2203/019* (2013.01); *B81C 2203/0109* (2013.01); *H01L 23/10* (2013.01); *H01L 2224/32145* (2013.01); *H01L 2924/1433* (2013.01); *H01L 2924/1461* (2013.01)

(58) Field of Classification Search
CPC ............. H01L 2924/1461; H01L 2224/32145; H01L 23/10; H01L 2924/1433
See application file for complete search history.

(56) References Cited

U.S. PATENT DOCUMENTS

| | | | | |
|---|---|---|---|---|
| 2013/0285165 A1* | 10/2013 | Classen | ............... | B81C 1/00238 257/415 |
| 2013/0299924 A1* | 11/2013 | Weber | ................... | B81B 3/0021 257/415 |
| 2013/0299928 A1* | 11/2013 | Classen | ................. | B81B 3/0075 257/417 |
| 2015/0115376 A1* | 4/2015 | Chen | .................... | B81B 3/0094 257/415 |

* cited by examiner

*Primary Examiner* — John C Ingham
(74) *Attorney, Agent, or Firm* — Norton Rose Fulbright US LLP (57) ABSTRACT

A hybridly integrated component includes an ASIC element having circuit functions which are integrated into the ASIC substrate; a layer structure on the ASIC substrate which includes at least one wiring level; a MEMS element including at least one micromechanical structure component which extends over the entire thickness of the MEMS substrate; and a cap wafer. The MEMS element is mounted on the ASIC layer structure. The cap wafer is mounted over the MEMS element in a pressure-tight manner. A sealing structure is formed in the MEMS substrate which completely surrounds the micromechanical structure component and extends over the entire thickness of the MEMS substrate at least up to the ASIC layer structure. The cap wafer is joined circumferentially to the MEMS substrate in the area of the sealing structure.

7 Claims, 7 Drawing Sheets

HYBRIDLY INTEGRATED MODULE HAVING A SEALING STRUCTURE

BACKGROUND OF THE INVENTION

1. Field of the Invention

The present invention relates to a hybridly integrated module which includes at least one ASIC element, one MEMS element, and one cap wafer. The ASIC element is configured with circuit functions which are integrated into the ASIC substrate. The ASIC element furthermore includes a layer structure on the ASIC substrate which includes at least one wiring level for the circuit functions. At least one micromechanical structure component, which extends over the entire thickness of the MEMS substrate, is formed in the MEMS element. The MEMS element is mounted on the layer structure of the ASIC element, so that a gap exists between the micromechanical structure component and the ASIC element. The cap wafer is mounted over the MEMS element in a pressure-tight manner, so that the micromechanical structure component is situated in a sealed cavity between the ASIC element and the cap wafer.

2. Description of the Related Art

The module concept of vertically hybridly integrated modules of the type in question here allows cost-effective mass production of very small, compact and robust modules having a micromechanical function and the associated circuit functions for signal processing. For this purpose, the individual module components—ASIC element, MEMS element and cap—are not only produced on the uncut wafer; their assembly to form a module also generally takes place on the uncut wafer. Moreover, the MEMS functions and the ASIC functions may be tested at the wafer level, and even the balancing of the modules may still be carried out at the wafer level prior to the separation.

To manufacture such a vertically hybridly integrated module, initially the ASIC substrate is processed and provided with a layer structure having wiring levels for the individual circuit functions. Then, the starting substrate for the MEMS element is mounted on this layer structure. The mechanical joint between the MEMS substrate and the ASIC layer structure is generally produced in a direct bonding process, the process temperature having to be kept at a relatively low level, preferably under 500° C., so as not to damage the circuit functions in the ASIC substrate. If the circuit functions of the ASIC element are exposed to higher process temperatures, it is possible that their functionality may no longer be ensured. The MEMS substrate is structured only after it is mounted on the ASIC layer structure to expose the structure components of the micromechanical function. Then the cap wafer is positioned over the micromechanical structure component and is either joined to a frame area of the MEMS substrate or is mounted on the ASIC layer structure, if during the structuring of the MEMS substrate a corresponding circumferential mounting surface was exposed on the ASIC layer structure. In any case, the mounting of the cap wafer must also be carried out at relatively low process temperatures out of consideration for the integrated circuit functions in the ASIC substrate.

In many applications, such as sensor applications, the cap wafer is not only used as mechanical protection, but also to hermetically seal the micromechanical structure components and to implement defined pressure conditions for the micromechanical function of the MEMS element.

In this connection, the direct bonding process for assembling the MEMS substrate and the cap wafer proves to be problematic. This is because at low process temperatures, which are non-critical for the ASIC circuit functions, no permanently pressure-tight joints may be established between the substrates and the layer materials which are typically used as the MEMS substrate and cap wafer and for the ASIC layer structure. For example, during the direct bonding of a silicon substrate and an oxide layer, annealing temperatures of over 1000° C. are required if this joint is to remain pressure-tight over the service life of the module.

BRIEF SUMMARY OF THE INVENTION

The present invention provides measures which allow pressure-tight joints to be implemented between the individual module components and the cap wafer of a hybridly integrated module of the type mentioned at the outset, even at comparatively low process temperatures.

This is achieved according to the present invention by forming a sealing structure in the MEMS substrate, which completely surrounds the micromechanical structure component and extends over the entire thickness of the MEMS substrate at least up to the layer structure of the ASIC element, and by the cap wafer being circumferentially joined to the MEMS substrate in the area of the sealing structure.

It was recognized according to the present invention that the joint between the MEMS substrate and the ASIC layer structure does not have to be hermetically sealed across the entire surface to enclose the micromechanical structure component in a pressure-tight manner in a cavity between the ASIC layer structure and the cap wafer. To also be able to use assembly methods which do not allow any permanently pressure-tight planar joints to be established between the MEMS substrate and the ASIC layer structure, it is provided according to the present invention to subsequently seal the planar assembly joint between the MEMS substrate and the ASIC layer structure, and in particular with the aid of a sealing structure, which is formed only in a frame area of the MEMS substrate surrounding the micromechanical structure component. Such a sealing structure may be easily created with the aid of standard structuring and deposition processes, which may be integrated into the processing of the MEMS substrate without any noteworthy added complexity, and in particular require no excessively high process temperatures.

According to the present invention, the cap wafer is then mounted on the MEMS substrate and is circumferentially joined to the same in the area of the sealing structure, so that a hermetic joint with the cap wafer is also established with the aid of the sealing structure. Since the cap wafer is mounted on the MEMS substrate—and not on the ASIC layer structure—only a comparatively minor structuring depth is required here. The structuring of the cap wafer is accordingly uncomplex.

The composition concept according to the present invention is in particular suitable for applications which necessitate a MEMS function which is sealed in a pressure-tight manner, such as acceleration and rotation rate sensors. However, this composition concept is independent of the concrete embodiment of the micromechanical structure component of the MEMS element and the functionality of the ASIC element. As a result, there are many options for implementing a module according to the present invention. Moreover, generally there are also various options for implementing the sealing structure according to the present invention, both as far as its arrangement, geometry and structure is concerned, and with regard to the materials used for this purpose.

As was already mentioned, according to the present invention the sealing structure extends at least up to the layer structure of the ASIC element. Since the sealing action is based on a joint between the material of the sealing structure and the adjoining materials of the MEMS substrate and of the ASIC layer structure, particularly good sealing action may frequently be achieved—depending on the layer materials and the layer sequence of the ASIC layer structure—by the sealing structure extending not only over the entire thickness of the MEMS substrate, but also into the layer structure of the ASIC element.

In one preferred specific embodiment of the present invention, the sealing structure extends up to a wiring level or up to a buried polysilicon layer of the ASIC layer structure. Advantageously, an annular sealing surface corresponding to the sealing structure is then formed in this wiring level or buried polysilicon layer.

At least in the area of the MEMS substrate, the sealing structure is advantageously implemented in the form of at least one circumferential, filled trench, the filler material forming a pressure-tight joint with the surrounding material of the MEMS substrate and of the ASIC layer structure. The trench structure may be easily created after the assembly of the MEMS substrate, so that it extends over the entire thickness of the MEMS substrate and, if necessary, also into the layer structure of the ASIC element. Thereafter the trench structure is filled in a standard deposition process, for example, advantageously still prior to the structuring process, in which the micromechanical structure component of the MEMS element is exposed.

Particularly good sealing action is provided by sealing structures having multiple, i.e., for example two, filled trenches, which are situated circumferentially around the micromechanical structure component and so as to extend essentially concentrically or in parallel.

As was already mentioned, the filler material should form a sealing joint with the materials of the adjoining MEMS substrate and of the ASIC layer structure. However, the filler material may also be assigned additional functions in the module. For example, in one advantageous specific embodiment of the present invention, the at least one trench of the sealing structure is filled at least in some areas with an electrically conductive material to use the sealing structure as an electrical connection between the MEMS element and the ASIC element. When suitably selecting the filler material, this material may also be used as the joining material for a eutectic bond joint between the cap wafer and the MEMS substrate.

Metals and/or metallic compounds, in particular including tungsten, titanium or titanium nitride, but also semiconductor materials, such as Ge, SiGe or Si, are particularly suitable as filler materials for the sealing structure.

The sealing structure according to the present invention may be exclusively made of one or multiple filled trenches, which completely surround the micromechanical structure component and extend over the entire thickness of the MEMS substrate at least up to or into the layer structure of the ASIC element. In one advantageous refinement of the present invention, the sealing structure continues in the form of circumferential metallic joints between the wiring levels in the ASIC layer structure. Such circumferential metallic joints between the wiring levels may already be easily created when depositing the individual layers of the ASIC layer structure.

Depending on the arrangement of the sealing structure, this structure may be used only to seal a cavity in which the micromechanical structure component of the MEMS element is enclosed, or also to seal additional functions of the module, in particular for sealing vias and the circuit functions of the ASIC element. For this purpose, the sealing structure is advantageously designed circumferentially in the outer edge region of the module.

It shall also be noted at this point that a module according to the present invention may of course also be configured with multiple such sealing structures, for example to separately seal individual module functions or to implement also an edge seal, in addition to sealing a cavity.

DETAILED DESCRIPTION OF THE INVENTION

Figure 1A:
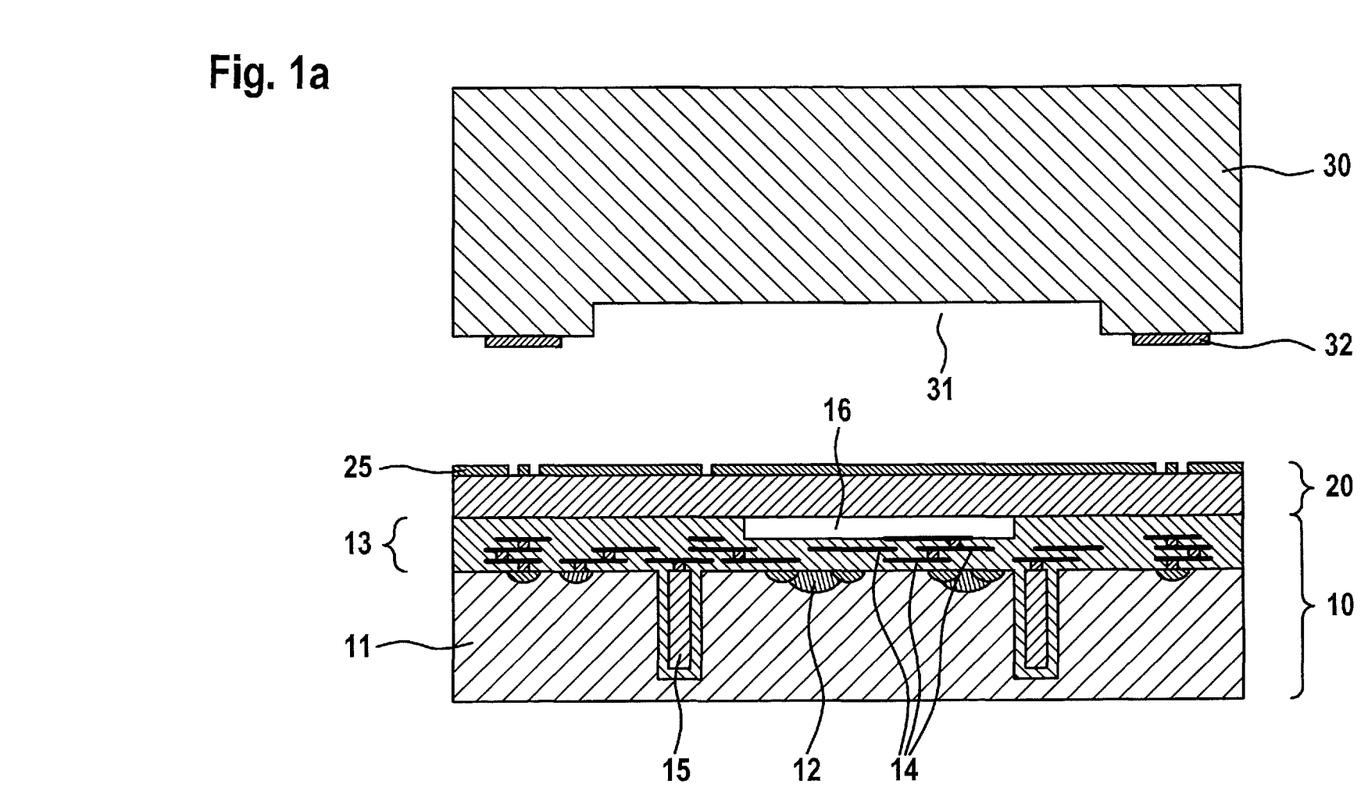
FIGS. 1a through 1f illustrate, based on schematic sectional views, the manufacture of a vertically hybridly integrated sensor module 100 having a sealing structure according to the present invention.

The vertically hybridly integrated sensor module 100 shown in FIG. 1f, whose composition will be described hereafter based on FIGS. 1a through 1f, includes three chip components, namely one ASIC element 10 having integrated circuit functions 12 and a layer structure 13 having wiring levels 14 for these circuit functions 12, one MEMS element 20 including a micromechanical sensor component 21, and one cap wafer 30. Sensor module 100 is implemented in the form of a stack or chip stack of these three chip components 10, 20 and 30.

It shall be noted at this point that both the processing of individual chip components 10, 20 and 30 and their assembly to form a stack is usually carried out on the uncut wafer, i.e., in combination with a plurality of identical module components which are produced in a grid arrangement from a wafer. For the sake of clarity, however, FIGS. 1f through 1f always show only the chip components of one module.

The starting point for manufacturing sensor module 100 is an ASIC substrate 11, which was initially processed independently of the other module components. For this purpose, on the one hand, vias 15 in the form of metallically filled blind holes were created and, on the other hand, circuit functions 12 were integrated. Thereafter, a layer structure 13 having wiring levels 14 for vias 15 and circuit functions 12 was created on ASIC substrate 11. Finally, the dielectric sealing layer of layer structure 13 was structured to create a cavern 16 in the area beneath sensor structure 21 of MEMS element 20.

Circuit functions 12 of ASIC element 10 are advantageously parts of a signal processing and evaluation or actuation circuit for micromechanical sensor component 21 of MEMS element 20. It shall be noted at this point that the ASIC element 10 may also include MEMS-independent circuit functions.

An unstructured MEMS substrate 20 was then also bonded to layer structure 13 of ASIC element 10 thus processed, and in particular in a direct bonding process at a low temperature. FIG. 1a shows this ASIC/MEMS composition prior to a first structuring step, in which a circumferential trench structure is to be created for a sealing structure according to the present invention, and an aperture is to be created for a via between the sensor structure still to be created and ASIC element 10. For this purpose, MEMS substrate 20 was provided with an appropriately structured masking layer 25.

Over the ASIC/MEMS composition, a structured cap wafer 30 having a cavern 31 and a circumferential bonding frame 32 is shown, which is formed here by a circumferential AL coating. Cap wafer 30 was prepared independently of the ASIC/MEMS composition.

Figure 1B:
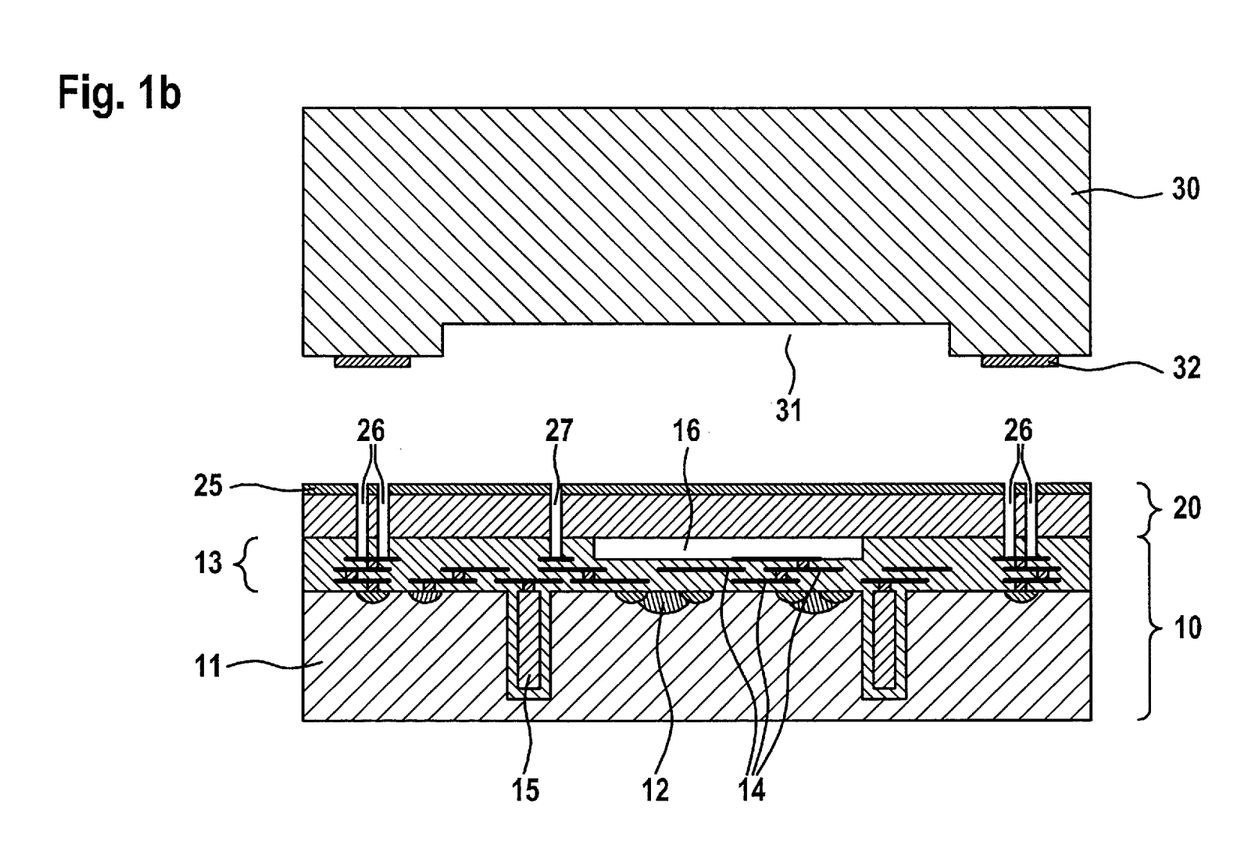

FIG. 1b shows the ASIC/MEMS composition after the first structuring step. Both circumferential trench structure 26 for the sealing structure and via aperture 27 extend not only over the entire thickness of MEMS substrate 20, but still into ASIC layer structure 13, and in particular up to uppermost wiring level 141 of this layer structure 13. Trench structure 26 here includes two concentrically situated annular trenches, which are formed in the outer edge region of the ASIC/MEMS composition. These two trenches 26 are advantageously narrower than 5 µm, so that they require preferably little chip surface and may be easily filled again. In the exemplary embodiment shown here, they end on a continuous annular region in uppermost wiring level 141, which is joined to subjacent wiring levels 142 and 143 of layer structure 13 via circumferential metallic joints 144. It shall be noted at this point that the trench structure may alternatively also include only one circumferential trench or more than two trenches. These may alternatively also extend up to a lower lying wiring level or up to another material layer of the layer structure, such as a polysilicon layer. The trench structure also does not have to be formed in the edge region of MEMS element 20; it may also be situated further to the inside, in the edge region of the sensor structure still to be created.

In a subsequent deposition process, trench structure 26 and via aperture 27 were filled with an electrically conductive material which forms a good, i.e., tight, joint with the adjoining materials of MEMS substrate 20 and of layer structure 13. The MEMS substrate used is usually a silicon substrate. The layer structure is then generally formed of a sequence of dielectric silicon oxide layers and metallic wiring levels made of aluminum, titanium and/or copper. In this case, in particular germanium (Ge), GeSi compounds or also amorphous silicon are suitable for filling trench structure 26 and via aperture 27. On the one hand, these materials allow largely conforming deposition using standard processes, such as a CVD process, a very good, tight joint with the adjoining materials being created by diffusion or phase formation. On the other hand, the necessary electric conductivity of these filler materials may be easily achieved by suitable doping. In addition to the aforementioned semiconductor materials, however, metals and metallic compounds are also suitable as filler materials, such as tungsten, titanium or titanium nitride.

Figure 1C:
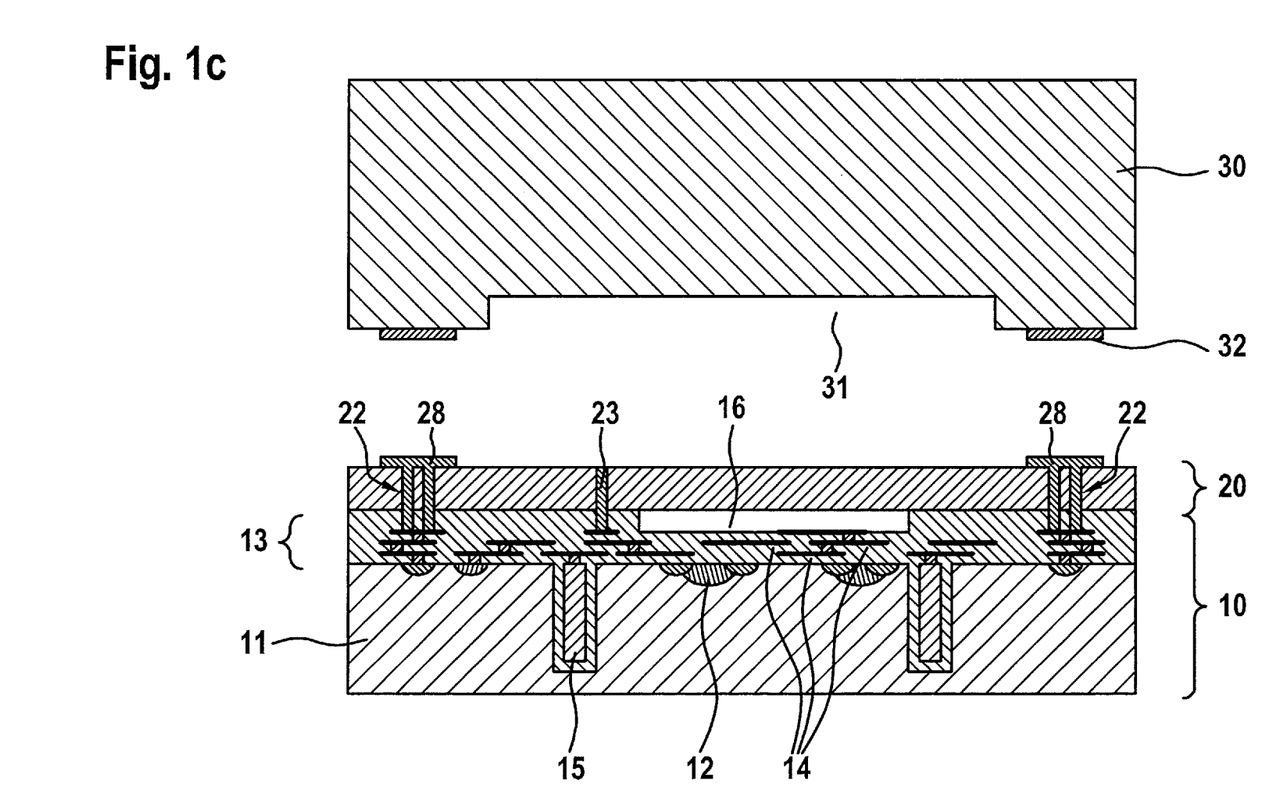

FIG. 1c shows the ASIC/MEMS composition after the deposition process. For this purpose, on the one hand via aperture 27 was filled, whereby a via 23 was created as an electrical connection of sensor structure 21 still to be created to ASIC element 10. On the other hand, trench structure 26 was filled, whereby a circumferential sealing structure 22 was created. This structure surrounds not only sensor structure 21 still to be implemented over cavern 16, but also further module functions, such as via 23. The sealing action of filled trench structure 26 continues in the area of ASIC layer structure 13, and in particular in the form of circumferential metallic joints 144 between wiring levels 141 through 143.

During the deposition process, not only trench structure 26 and via aperture 27 were filled. Additionally, the top side of MEMS substrate 20 was coated with the filler material. This coating was structured after the deposition process. The filler material was removed again from the surface of MEMS substrate 20 for this purpose, with the exception of an annular area over the sealing structure, which acts as joining area or bonding frame 28 for cap wafer 30. Since the filler material is electrically conductive in the exemplary embodiment described here, a defined electrical potential may be applied to bonding frame 28 via ASIC element 10.

Figure 1D:
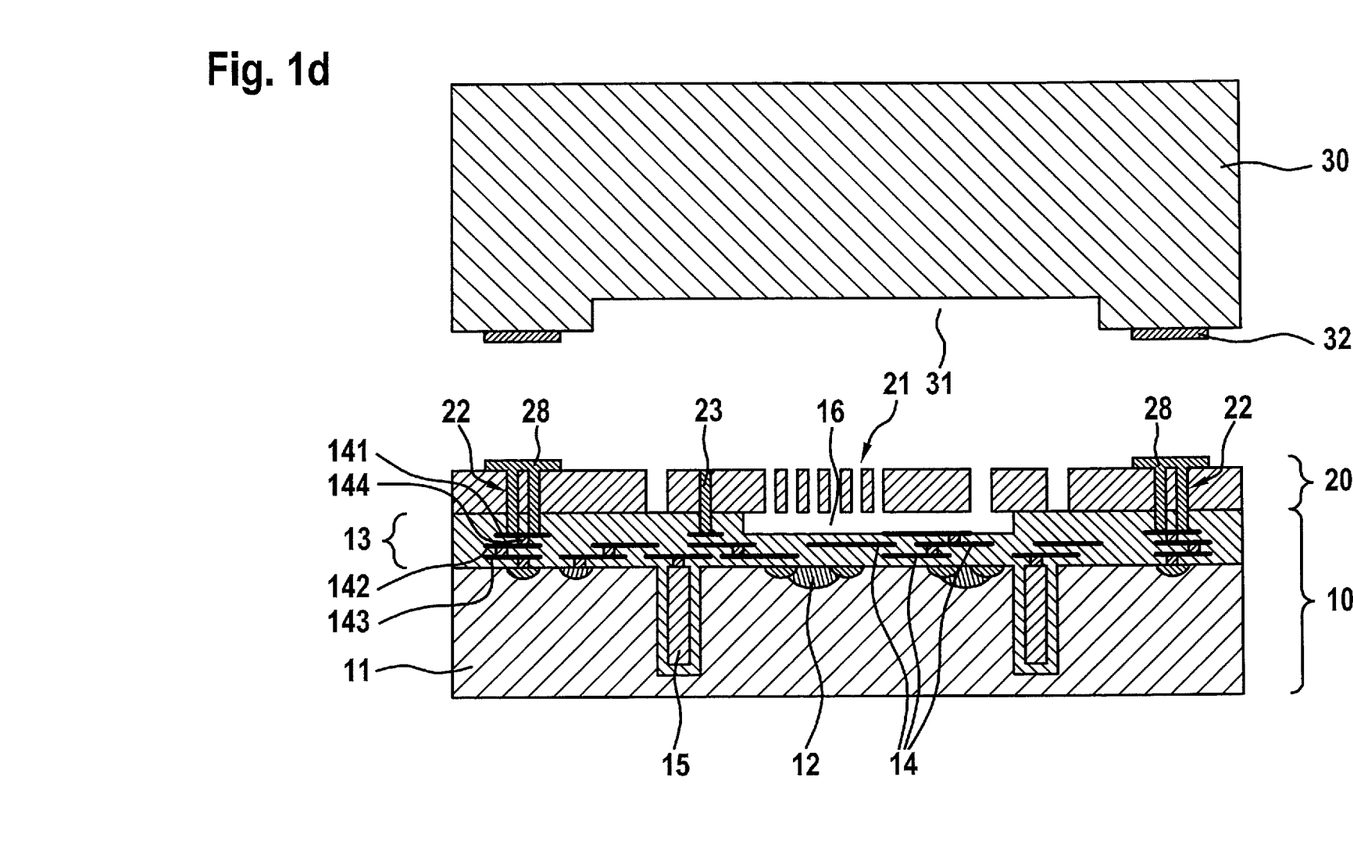

Micromechanical structure 21 was only exposed after the completion of sealing structure 22 and of via 23. The result of this further structuring process is illustrated in FIG. 1d.

Figure 1E:
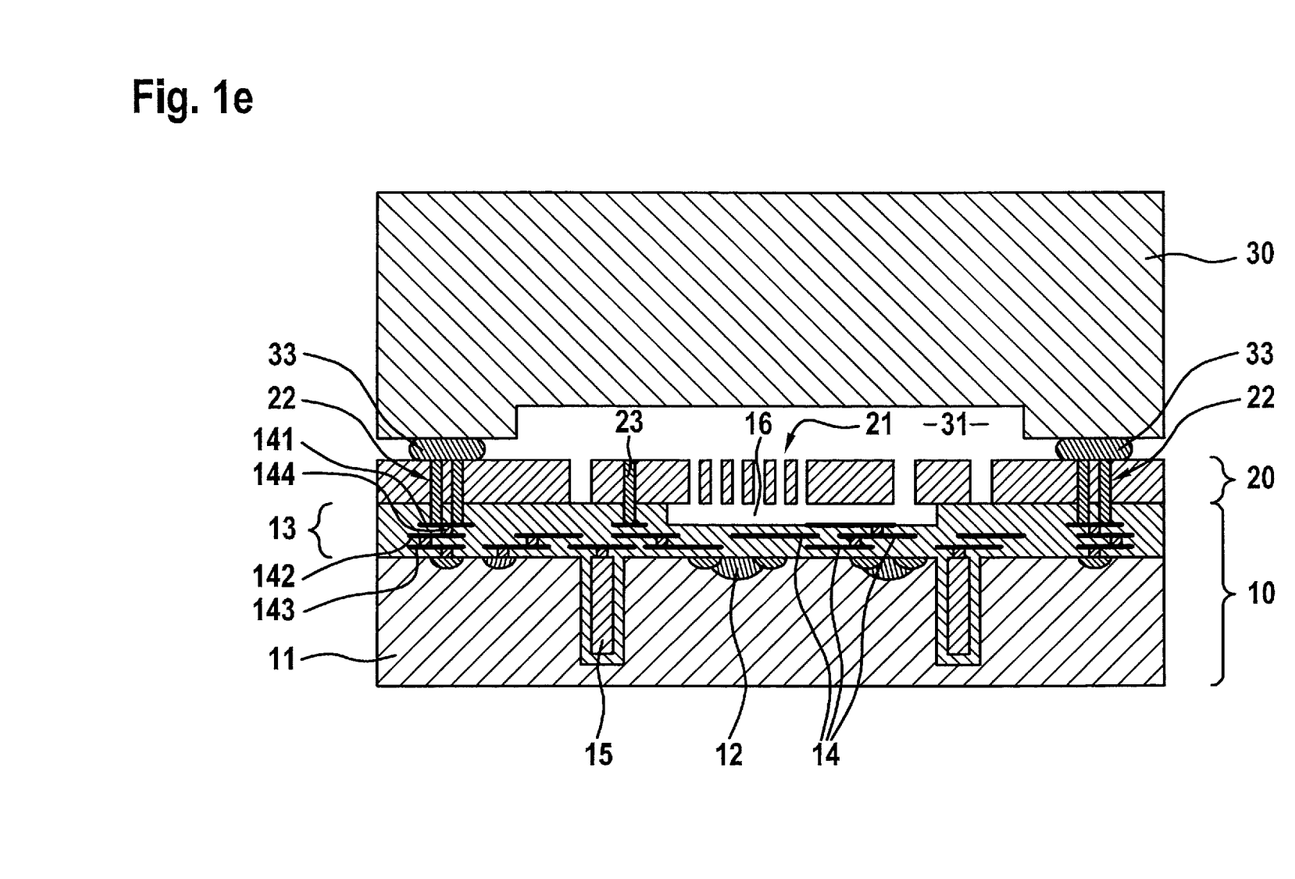
Figure 1F:
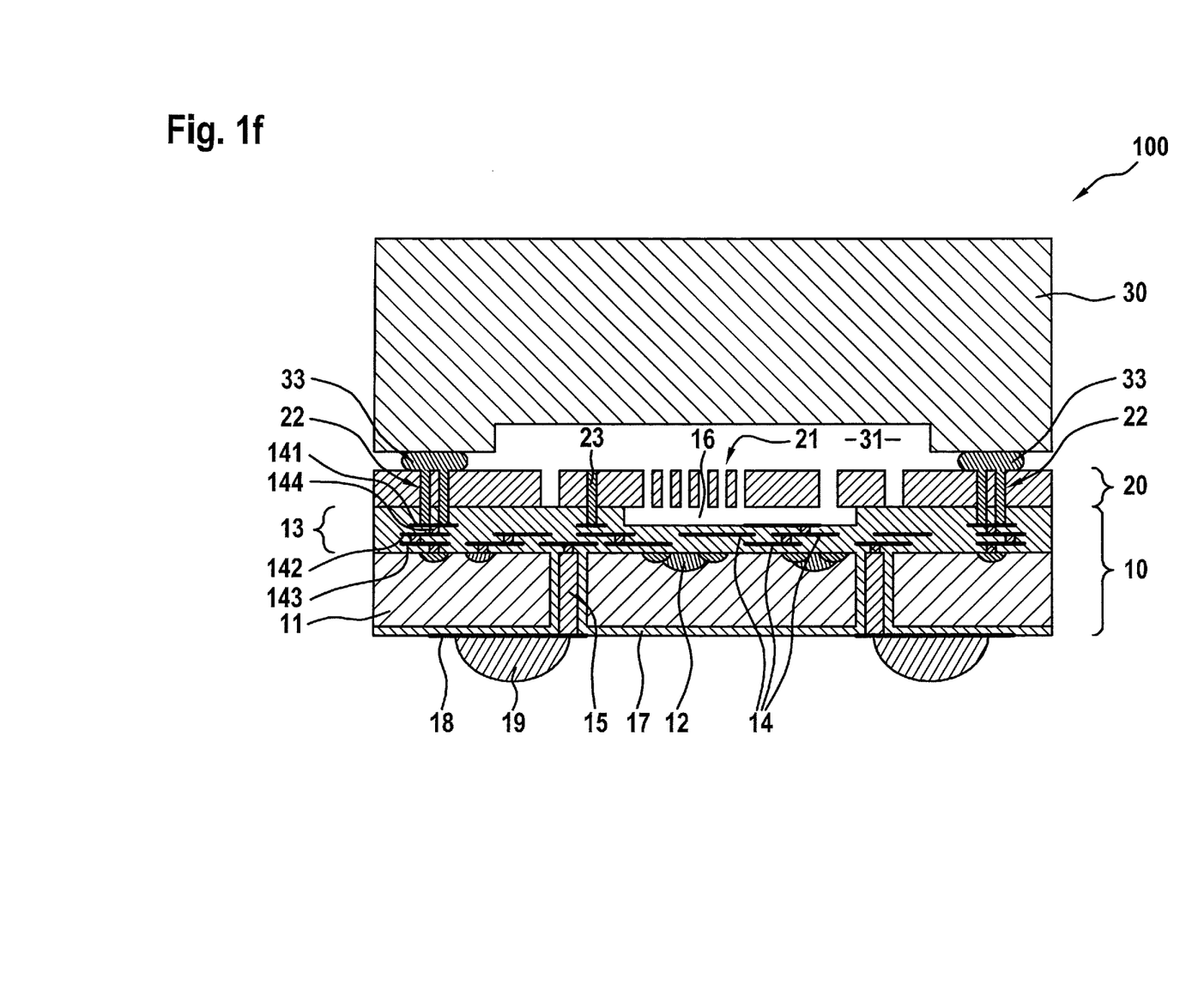

Thereafter, cap wafer 30 was mounted on MEMS substrate 20, so that cavern 31 is situated over sensor structure 21. Pressure-tight joint 33 between cap wafer 30 and MEMS substrate 20 was established here by eutectic bonding. For this purpose, a eutectic joint was established between Al bonding frame 32 of cap wafer 30 and the material of bonding frame 28 via sealing structure 22 in MEMS substrate 20. The filler material for sealing structure 22 here was thus also used as joining material for assembling cap wafer 30. FIG. 1e shows that sensor structure 21 in this composition is enclosed within a cavity 16, 31 between ASIC layer structure 13 and cap wafer 30, and that this cavity 16, 31 is hermetically tightly sealed by sealing structure 22, 144 in MEMS substrate 20 and in ASIC layer structure 13, and by eutectic bond joint 33 between MEMS substrate 20 and cap wafer 30.

In a last method step, ASIC substrate 11 of sensor module 100 was thinned at the rear side to expose vias 15 for external module contacting. The ASIC rear side was provided with a passivation layer 17, a wiring level having connecting pads 18 and solder bumps 19, which is illustrated in FIG. 1f.

Figure 2:
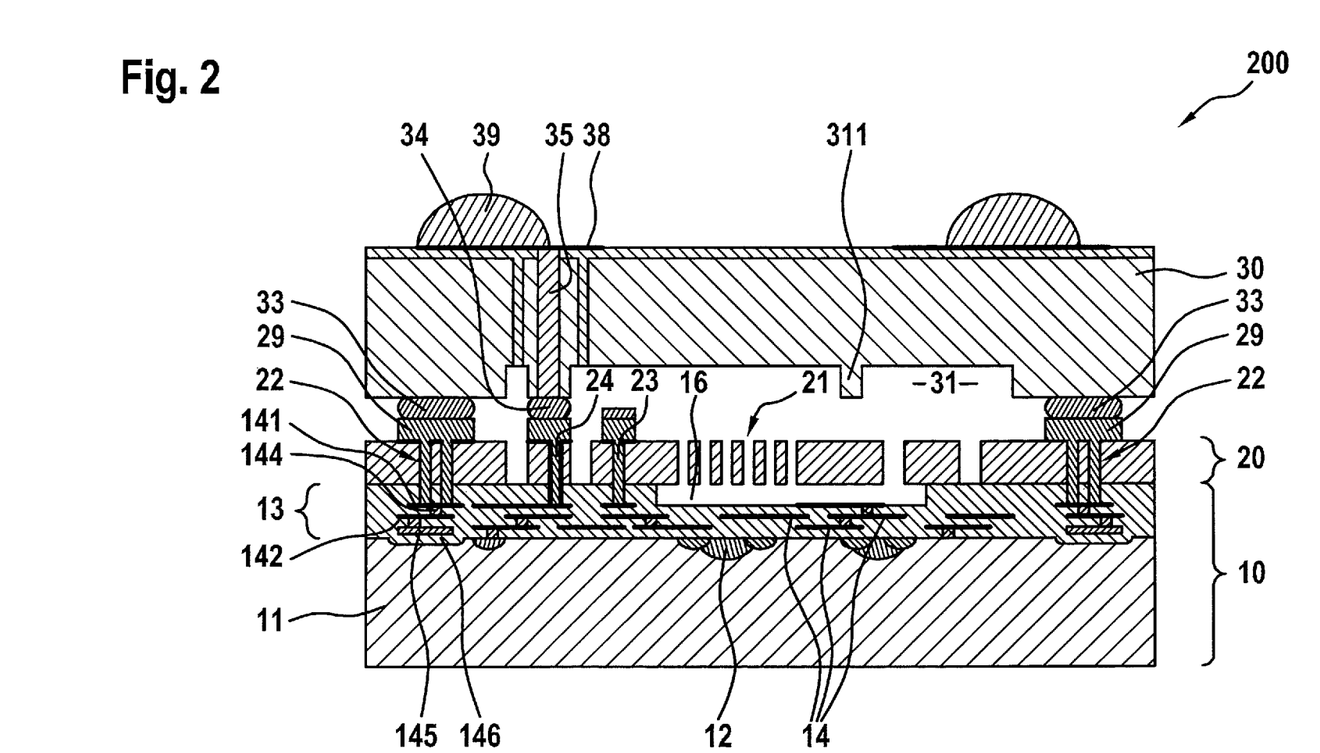
FIG. 2 shows a schematic sectional view of a further vertically hybridly integrated sensor module 200 having a sealing structure according to the present invention.

Vertically hybridly integrated sensor module 200 shown in FIG. 2 is also composed in the form of a chip stack, which includes one ASIC element 10 having integrated circuit functions 12 and a layer structure 13, one MEMS element 20 including a micromechanical sensor component 21, and one cap wafer 30. Contrary to sensor module 100, the 2nd level assembly and external electrical contacting of sensor component 200 does not take place via the ASIC element, but via cap wafer 30.

For this purpose, cap wafer 30 was prepared even prior to being mounted on the ASIC/MEMS composition by creating a via 35 which is connected to a wiring level having connecting pads 38 for solder bumps 39 on the top side of the cap. Within the scope of this pre-processing, additionally the bottom side of cap wafer 30 was structured to create a cavern 31 for sensor structure 21 of MEMS element 20. A stop 311 was also formed in the area of cavern 231 as overload protection for sensor structure 21. For the assembly on MEMS element 20, finally also a bonding frame and a bonding contact for via 35 were applied to the bottom side of cap wafer 30.

As in the case of sensor module 100, MEMS element 20 of sensor module 200 is also sandwiched between ASIC element 10 and cap wafer 30. A circumferential sealing structure 22 is formed in the outer edge region of MEMS element 20. In the area of sealing structure 22, cap wafer 30 is circumferentially joined to MEMS substrate 20 so that sensor structure 21 is hermetically tightly enclosed in a cavity between ASIC layer structure 13 and cap wafer 30.

Sealing structure 22 of sensor module 200 includes a trench structure, which extends over the entire thickness of MEMS substrate 20 up to uppermost wiring level 141 of ASIC layer structure 13 and is made up of two concentrically situated, circumferential trenches. These trenches are filled with a material which forms a sealing joint with the adjoining materials of MEMS substrate 20 and of ASIC layer structure 13. In the case of sensor module 200, a barrier layer, for example made of Ti or TiN, was initially deposited on the wall of the trench structure and also on the via apertures before the trenches and the via apertures were filled with a CVD metal filler, for example made of tungsten. A relatively thick metal layer 29 was also created on the top side of MEMS substrate 20 during this deposition process. A bonding layer was then applied to this metal layer 29 and structured to create a bonding frame and a bonding contact in the area over sealing structure 22 for mounting cap wafer 30, which correspond to the bonding frame and the bonding contact on the bottom side of cap wafer 30. Al and Ge were used as the bonding materials, since the resulting eutectic bond joints 33 and 34 are electrically conducting and mechanically very robust. After the bonding layer was structured, metal layer 29 was also structured, which functions here as a spacer layer for cap wafer 30. Contrary to sensor module 100, the filler material for sealing structure 22 in the case of sensor module 200 was thus not used as joining material for mounting cap wafer 30, but to implement a spaced structure for cap wafer 30.

In ASIC layer structure 13, sealing structure 22 continues in circumferential metallic joints between uppermost wiring level 141 and a further wiring level 142 as well as a polysilicon layer 145 of layer structure 13. Polysilicon layer 145 was deposited on a thermal oxide layer 146 of layer structure 13. This layer sequence is hermetically sealed over the service life of module 200.

As was already mentioned, the external electrical contacting of sensor module 200 takes place with the aid of via 35 in cap wafer 30, which is connected to the wiring levels of ASIC element 10 via a eutectic bond joint 34 and a via 24 in MEMS substrate 20. Due to the arrangement of vias 23 and 24 within the area surrounded by sealing structure 22, it is not necessary here to conduct sensor or ASIC signals laterally to the outside beneath sealing structure 22. However, this could be necessary in another implementation of the external contacting and a sealing structure situated further to the inside. The electrical signals may then be simply conducted to the outside via an area of the ASIC substrate which is suitably diffused in, or via a polysilicon layer of the ASIC layer structure, which is still situated beneath the sealing structure.

What is claimed is:

1. A hybridly integrated module, comprising:
    an ASIC element having an ASIC substrate with circuit functions integrated into the ASIC substrate, wherein a layer structure is provided on the ASIC substrate and includes at least one wiring level for the circuit functions;
    a MEMS element including a substrate and at least one micromechanical structure component which extends over the entire thickness of the substrate of the MEMS; and
    a cap wafer;
    wherein the MEMS element is mounted on the ASIC layer structure so that a gap exists between the micromechanical structure component and the ASIC element;
    wherein the cap wafer is mounted over the MEMS element in a pressure-tight manner, so that the micromechanical structure component is situated in a sealed cavity between the ASIC element and the cap wafer;
    wherein a sealing structure is formed in the MEMS substrate, the sealing structure completely surrounding the micromechanical structure component and extending over the entire thickness of the MEMS substrate at least up to the ASIC layer structure, and wherein the cap wafer is circumferentially joined to the MEMS substrate in the area of the sealing structure;
    wherein the sealing structure extends into the ASIC layer structure;
    wherein the sealing structure includes at least one circumferential trench which extends over the entire thickness of the MEMS substrate at least up to the ASIC layer structure, and the trench is filled with a material which forms a pressure-tight joint with the surrounding material of the MEMS substrate and of the ASIC layer structure; and
    wherein the sealing structure continues in the area of the ASIC layer structure in the form of circumferential metallic joints between the wiring levels.

2. The module as recited in claim 1, wherein the sealing structure extends one of (i) up to a wiring level or (ii) up to a buried polysilicon layer of the ASIC layer structure, and an annular sealing surface corresponding to the sealing structure is formed in the one of the wiring level or the buried polysilicon layer.

3. The module as recited in claim 1, wherein the sealing structure includes multiple circumferential trenches which are situated so as to extend essentially concentrically or in parallel.

4. The module as recited in claim 1, wherein the at least one trench of the sealing structure is filled at least in some areas with an electrically conductive material, and the sealing structure provides an electrical connection between the MEMS element and the ASIC element.

5. The module as recited in claim 1, wherein the at least one trench of the sealing structure is filled with a material which is a joining material for a eutectic bond joint between the cap wafer and the MEMS substrate.

6. The module as recited in claim 1, wherein the at least one circumferential trench of the sealing structure is filled with at least one of tungsten, titanium, titanium nitride, and a semiconductor material.

7. The module as recited in claim 1, wherein:
    the ASIC element, the MEMS element and the cap wafer have essentially the same chip surface;
    the sealing structure is formed circumferentially in the outer edge region of the module; and
    the external electrical contacting of the module takes place with the aid of vias in at least one of the ASIC element and the cap wafer.

* * * * *